(12) United States Patent
Franz et al.

(10) Patent No.: US 10,791,648 B1
(45) Date of Patent: Sep. 29, 2020

(54) TRANSFERRING THERMAL ENERGY TO COOLANT FLOWS

(71) Applicant: HEWLETT PACKARD ENTERPRISE DEVELOPMENT LP, Houston, TX (US)

(72) Inventors: John Franz, Houston, TX (US); Tahir Cader, Spokane Valley, WA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/364,980

(22) Filed: Mar. 26, 2019

(51) Int. Cl.
*H05K 7/20* (2006.01)
*F04D 29/58* (2006.01)

(52) U.S. Cl.
CPC ..... *H05K 7/20272* (2013.01); *F04D 29/5806* (2013.01); *F04D 29/586* (2013.01); *H05K 7/20772* (2013.01)

(58) Field of Classification Search
CPC .............. F04D 29/5806; F04D 29/586; H05K 7/20272; H05K 7/20772
See application file for complete search history.

(56) References Cited

U.S. PATENT DOCUMENTS

| 3,719,436 | A | | 3/1973 | McFarlin | |
|---|---|---|---|---|---|
| 4,876,492 | A | * | 10/1989 | Lester | H02K 7/14 318/400.08 |
| 5,779,453 | A | | 7/1998 | Nagayama et al. | |
| 7,168,926 | B2 | | 1/2007 | Manda et al. | |
| 9,267,497 | B2 | | 2/2016 | Guan et al. | |
| 2005/0152782 | A1 | * | 7/2005 | Shishido | F04D 3/00 415/220 |
| 2008/0025858 | A1 | * | 1/2008 | Hwang | F04C 18/084 418/10 |
| 2008/0164011 | A1 | * | 7/2008 | Chen | F04D 13/12 165/104.33 |
| 2009/0159244 | A1 | * | 6/2009 | Mouniloux | F04D 29/586 165/104.33 |
| 2013/0299139 | A1 | * | 11/2013 | Mouniloux | F28D 1/04 165/120 |

(Continued)

FOREIGN PATENT DOCUMENTS

| CN | 100513795 | 7/2009 |
|---|---|---|
| CN | 106949070 | 11/2017 |

OTHER PUBLICATIONS

Amazon.com, Inc., "Water Circulation Pump, Solar DC 12V Hot Water Circulation Micro Pump Brushless Motor Water Pump," 2018, pp. 1-6 (online), Retrieved from the Internet on Dec. 28, 2018 at URL: <amazon.ca/Water-Circulation-Solar-Micro-Brushless/dp/B01M4LLVLJ>.

(Continued)

*Primary Examiner* — Jacob R Crum
(74) *Attorney, Agent, or Firm* — Trop, Pruner & Hu, P.C.

(57) ABSTRACT

A pump includes an armature, a rotor assembly, a liquid path connector and a member. The armature includes a ferromagnetic core, a winding and a through passageway. The rotor assembly is disposed in the passageway and includes an impeller to rotate to pump liquid through the passageway. The liquid path connector is connected to the armature to communicate the liquid with the passageway. The member contacts an outer surface of the armature and contacts an outer surface of the liquid path connector to transfer thermal energy from the armature to the liquid path connector.

17 Claims, 8 Drawing Sheets

(56) References Cited

U.S. PATENT DOCUMENTS

2015/0252808 A1\* 9/2015 Rosinski ................. F04D 13/06
                                                        417/423.5
2017/0212560 A1\* 7/2017 Tsai .......................... G06F 1/20

OTHER PUBLICATIONS

Shavo Technologies PVT. LTD.; "Cooling Systems," 2018, pp. 1-2 (online), Retrieved from the Internet on Dec. 28, 2018 at URL: <xylem.com/en-us/brands/flygt/flygt-engineering--expertise/pump-technologies/cooling-systems/>.
Encyclopedia Magnetica,"Air Gap", available online at <https://web.archive.org/web/20181221222930/http://www.encyclopedia-magnetica.com/doku.php/air_gap>, Dec. 21, 2018, 23 pages.
Pentair, "Thermal Management Heat Dissipation in Electrical Enclosures", Equipment Protection Solutions, Spec-00488 E, available online at <https://web.archive.org/web/20181108194537/http://www.hoffmanonline.com/stream_document.aspx?rRID=233309&pRID=162533>, Nov. 8, 2018, 6 pages.

\* cited by examiner

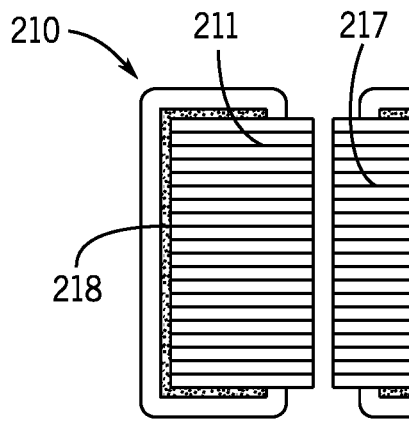
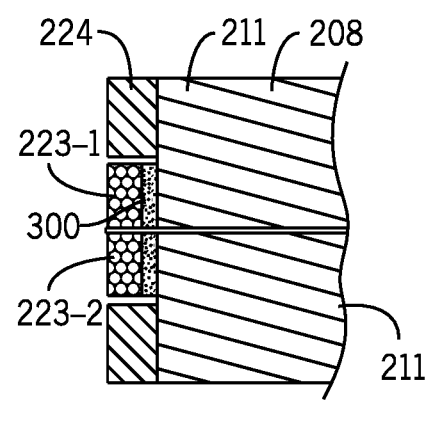
FIG. 3A    FIG. 3B
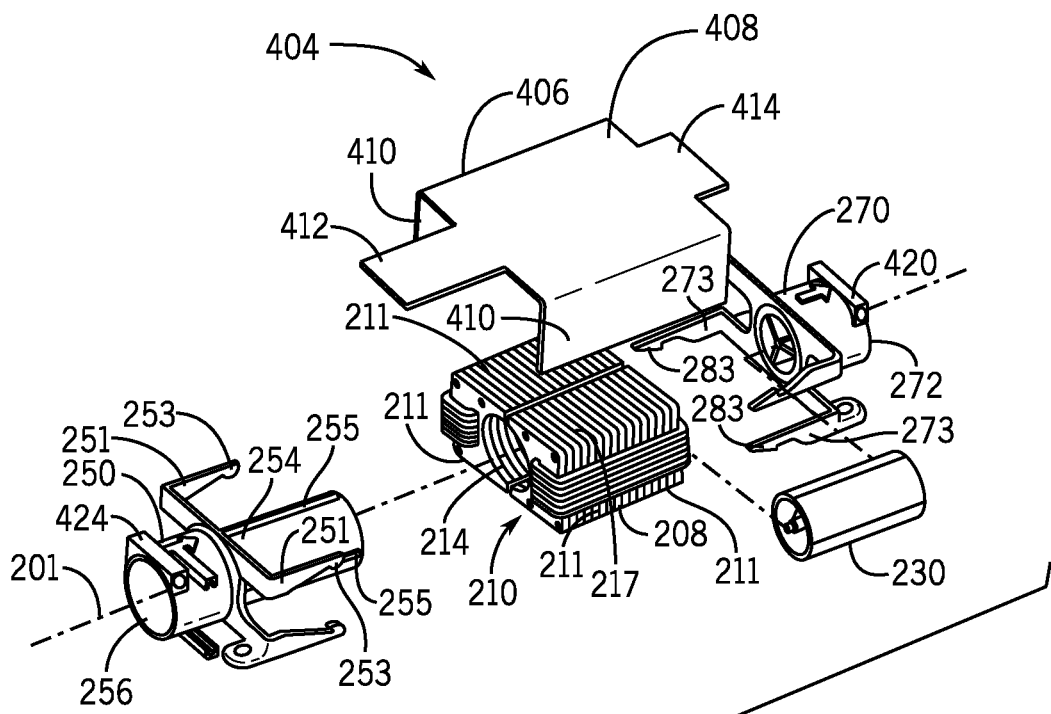
FIG. 4

TRANSFERRING THERMAL ENERGY TO COOLANT FLOWS

BACKGROUND

A processor-based system (a system containing one or multiple servers, for example) may generate a considerable amount of waste heat, which may cause components of the system to exceed their thermal specifications, if the thermal energy is not adequately removed. One way to remove the waste heat is through the use of an air-based cooling system in which one or multiple fans direct forced air across the heat dissipating components of the system and their associated heat sinks. Another way to remove waste heat is through the use of a liquid-based cooling system in which a liquid coolant is circulated near the heat dissipating components and their heat sinks, and the liquid coolant is further circulated through one or multiple heat exchangers (radiators, for example) to remove thermal energy from the liquid coolant.

BRIEF DESCRIPTION OF THE DRAWINGS

FIG. 3A is a top view of an armature of the pump assembly of FIG. 2 according to an example implementation.

FIG. 3B is a partial cross-sectional view of the armature of FIG. 3A taken along line 3B-3B of FIG. 3A.

FIG. 4 is an exploded perspective view of a portion of the pump assembly illustrating use of a thermally conductive plate to transfer waste heat to a liquid coolant flow according to a further example implementation.

DETAILED DESCRIPTION

Figure 1:
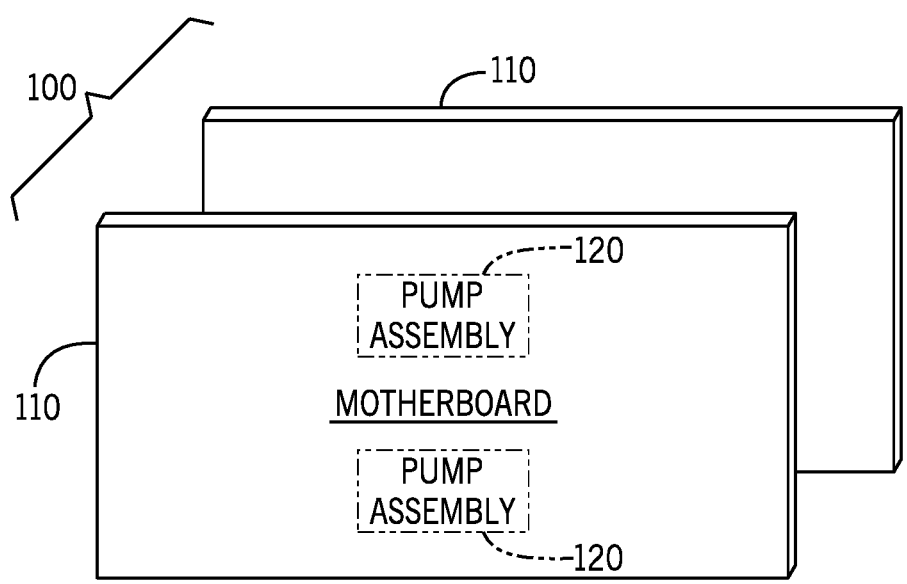
FIG. 1 is an illustration of a blade server having multiple micro-axial pump assemblies according to an example implementation.

A liquid-based cooling system may be used to remove waste thermal energy, or heat, from a system that includes heat dissipating components. For example, the system may be a computer system that includes one or multiple circuit board assemblies (motherboards, server blades, storage blades, and so forth) that contain heat dissipating components (central processing units (CPUs), graphics processors, network modules, power transistors, and so forth) and their associated heat sinks. The liquid-based cooling system may include one or multiple positive displacement pump assemblies, such as centrifugal pump assemblies, which move a liquid coolant (e.g., deionized water, glycol, and so forth) through a cooling circuit having parts that are disposed near heat dissipating components and their associated heat sinks. Moreover, the liquid coolant-based system may have multiple cooling circuits. For example, a secondary cooling circuit may circulate a liquid coolant to gather waste heat from the heat dissipating components and their heat sinks; and thermal energy from the liquid coolant in the secondary cooling circuit may be transferred through a heat exchanger to a secondary cooling circuit.

The secondary cooling circuit may contain liquid coolant pumps that are disposed in close proximities to the heat dissipating components and heat sinks of the computer system. Although part of the overall cooling system, the operations of the liquid coolant pump assemblies produce waste heat, and even for a relatively small amount of waste heat, the cumulative waste heat from the liquid coolant pump assemblies may become significant when multiple pump assemblies are disposed within a relatively confined space (within a particular rack, within a particular server blade, and so forth).

As such, it may be beneficial to remove waste heat from the liquid coolant pump assembly. One way to remove waste heat from a liquid coolant pump assembly is through the use of forced convection by directing an air flow (an air flow produced by one or multiple ventilators, or fans, for example) over the pump assembly. A particular computer system that is liquid cooled, however, may not have fans to direct an air flow over a liquid coolant pump assembly. Moreover, even if the computer system has some degree of forced air convection in place, the liquid coolant pump assembly may be disposed in a confined space and not benefit from forced air removal of the assembly's waste heat.

In accordance with example implementations that are described herein, a liquid coolant pump assembly (also called a "coolant pump assembly" or a "pump assembly" herein) contains features to enhance the transfer of waste heat that is generated by the pump assembly to the liquid coolant that flows through the pump assembly. As such, the liquid coolant may be used as the primary path for removing waste heat that is produced by heat dissipating electronic components of the computer system and waste heat that is produced by the operation of the pump assembly.

More specifically, in accordance with example implementations that are described herein, the pump assembly contains an armature that is electrically actuated to produce a varying magnetic field to drive a rotating rotor assembly to displace the liquid coolant. The electrical actuation of the armature, in turn, produces waste heat. The pump assembly, in accordance with example implementations, contains a member, a thermally conductive plate, which serves as a thermal bridge to conduct waste energy from the armature to inlet and outlet connector housings of the pump assembly.

In accordance with example implementations, the liquid coolant flows through the inlet and outlet connector housings; the thermally conductive plate contacts the outer surface of the armature and the outer surfaces of the inlet and outlet connector housings; and the inlet and outlet connector housings are at least partially thermally conductive. Accordingly, waste heat due to operation of the pump assembly is transferred to the liquid coolant through an enhanced thermal conduction path: waste heat is transferred from the armature to the thermally conductive plate; thermal energy is transferred from the thermally conductive plate to the inlet and outlet connector housings; and thermal energy is transferred from the inlet and outlet connector housings to the liquid coolant.

In accordance with example implementations, the thermally conductive plate and each of the inlet and outlet assembly housings may be constructed from a highly conductive material. In accordance with further example implementations, the thermally conductive plate may be constructed from a highly thermally conductive material; and the inlet and outlet connector housings may be constructed from a thermally conductive material.

A material may have a thermal conductivity that is isotropic (i.e., the thermal conductivity is independent of direction) or anisotropic (i.e., the thermal conductivity varies with direction). As a more specific example, in accordance with some implementations, the inlet and outlet connector housings may be formed from a thermally conductive material using injection molding or using fused deposition modeling (i.e., three-dimensional printing using a thermoplastic filament). Along an axis that corresponds to the cross-flow (injection molding) or cross-print (fused deposition modeling) direction, the thermal conductivity may vary in a range between 0.5 and 12 $W \cdot m^{-1} \cdot K^{-1}$; and along an axis that corresponds to the flow (injection molding) or print (fused deposition modeling) direction, the thermal conductivity may vary in a range between 1 and 23 $W \cdot m^{-1} \cdot K^{-1}$ As used herein, a material is "thermally conductive" if it has thermal conductivity (often denoted k, λ, or κ) along a given axis of the polymer is of 0.5 or greater at any temperature between 0° C. and 100° C.

Examples of materials that are thermally conductive include almost all metals and their alloys (e.g., copper, aluminum, gold, etc.), some plastics (e.g., TECACOMP® TC compounds, CoolPoly® D-series Thermally Conductive Plastics), and many other materials. As used herein, a material is "highly thermally conductive" if it has thermal conductivity of 100 $W \cdot m^{-1} \cdot K^{-1}$ or greater at any temperature between 0° C. and 100° C. Examples of materials that are highly thermally conductive include copper, silver, gold, aluminum, and many other metals and their alloys.

In accordance with further implementations, the liquid coolant pump assembly may contain other and/or different features to enhance the transfer of the pump assembly's waste heat to the liquid coolant, such as, for example, thermally conductive materials to fill in otherwise existing air gaps of the pump assembly. As a more specific example, in accordance with some implementations, a thermally conductive epoxy may be used to fill in otherwise existing air gaps of the liquid coolant pump assembly. As an example, the thermally conductive epoxy may conduct heat 150 times better than air. As an example, air may have a thermal conductivity of approximately 0.02 W/mK, while a thermally conductive epoxy may have an isotropic thermal conductivity as high as 3 W/mK.

As an example of a specific gap that may be filled by a thermally conductive compound, such as a thermally conductive epoxy, due to imperfections in the winding of wire about the laminated ferromagnetic core of the armature, there may be one or multiple gaps between the windings and the core; and the thermally conductive epoxy may be used to fill these gap(s). This allows a more efficient thermal transfer of waste heat from the windings to the laminated ferromagnetic core, so that the waste heat may be removed via the core to the liquid coolant. Moreover, as further described herein, the use of a thermally conductive compound, such as thermally conductive epoxy, to fill any gaps between the winding and the laminated core may improve the power efficiency of the pump assembly.

Air gaps may be present in other parts of the liquid coolant pump assembly; and a thermally conductive compound, such as a thermally conductive epoxy, may be used in a similar manner to that described above for purposes of replacing the air gap with a better thermally conductive path to enhance the transfer of waste heat to the liquid coolant. For example, the ferromagnetic core may have a longitudinal central opening, or passageway, in which the pump's rotor assembly is disposed; and the inlet connector housing may extend inside the central passageway, such that the rotor assembly is contained within the inlet connector housing extension. A thermally conductive compound, such as a thermally conductive epoxy, may be disposed between the extension and the ferromagnetic core to fill in any gaps that may be present.

As a more specific example, FIG. 1 depicts a blade server 100 in accordance with example implementations. In general, the blade server 100 includes a pair of motherboards 110, and one or multiple micro-axial liquid coolant pump assemblies 120 (a pair of example liquid coolant assemblies 120 being depicted in FIG. 1) may be disposed between the motherboards 110 for purposes of removing waste heat that is produced by heat dissipating components (CPUs, switching transistors of power converters, and so forth) that are disposed on the motherboards 110. Due to the relatively confined space in which the coolant pump assemblies are disposed, air cooling may not be available to transfer that waste heat that is produced by operation of the pump assemblies 120 to the ambient. Rather, in accordance with example implementations, the liquid coolant pump assembly 120 has features that enhance the transfer of the liquid coolant pump assembly's waste energy to the liquid coolant that flows through the assembly 120.

Figure 2:
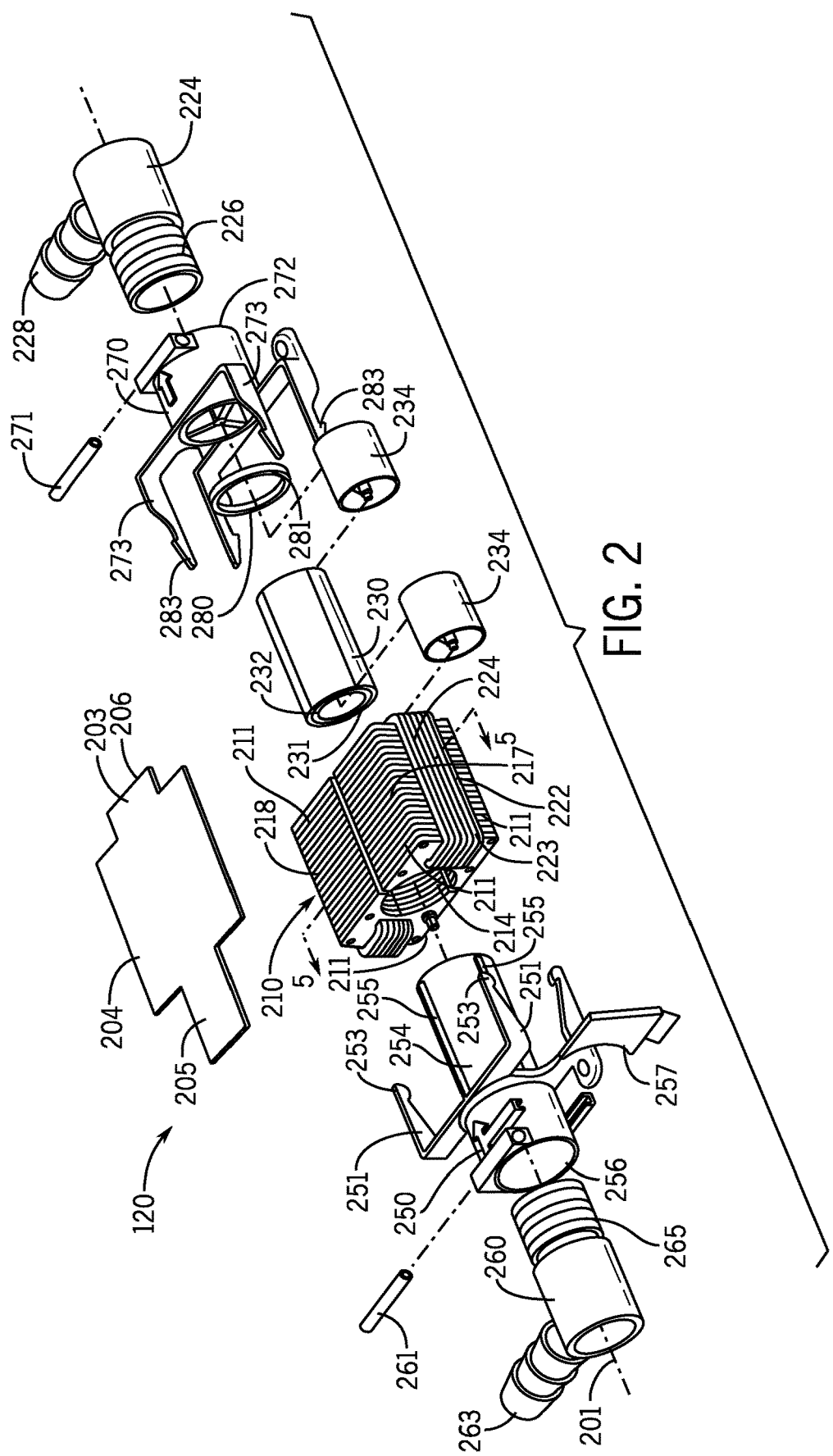
FIG. 2 is an exploded perspective view of a micro-axial pump assembly of FIG. 1 according to an example implementation.

FIG. 2 generally depicts an exploded perspective view of the coolant pump assembly 120 according to an example implementation. In general, in accordance with example implementations, the liquid coolant pump assembly 120 is an axial centrifugal pump that operates to move a liquid coolant (e.g., deionized water, glycol, and so forth) through the pump assembly 120. The liquid coolant pump assembly 120 receives liquid coolant at a fitting 260; and through operation of the assembly 120, the liquid coolant moves through the pump assembly 120 along the pump assembly's longitudinal axis 201 and exits the pump assembly 120 at a fitting 224.

The pump assembly 120 includes an electrically actuated motor that drives a pump to produce the forces to move, or pump, the liquid coolant. The motor includes a stationary armature 210 and a rotor assembly 230 that is disposed inside the armature 210. The armature 210 is electrically actuated to produce a varying magnetic field that causes the rotor assembly 230 to rotate. The rotor assembly 230 includes one or multiple impellers 234 (the pump); and the rotation of the rotor assembly 120 causes internal blades (depicted by reference numeral 515 in FIG. 5) of the impeller(s) 234 to displace liquid to move the liquid coolant through the pump assembly 120. For the example implementation depicted in FIG. 2, the pump assembly 120 includes two impellers 234.

The armature 210 includes a laminated ferromagnetic core 218 and one or multiple wire windings 223 (two windings 223 being depicted in the example implementation depicted in FIG. 2) that circumscribe respective parts 211 of the ferromagnetic core 218. The wire winding 223 may be disposed on a bobbin holder 224. Each part 211 of the ferromagnetic core 218 may be a stack of laminated, or insulated, ferromagnetic plates, with the lamination being in place to inhibit the formation of eddy currents in the core 218.

The ferromagnetic core 218 has a central, circular cylindrically-shaped bore 214 (i.e., a through passageway) that circumscribes and extends along the longitudinal axis 201 of the pump assembly 120. The rotor assembly 230 of the pump assembly 120 is disposed inside the central bore 214. The rotor assembly 230 includes a circular cylindrical permanent magnet 232 that is disposed inside an outer metal housing 231 of the rotor assembly. The impellers 234 are disposed inside the magnet 232.

In accordance with example implementations, in operation, a controller circuit board 257 contains circuitry to control the application of alternating DC voltages to the windings 223 of the armature 210 to create a varying magnetic field. The varying magnetic field, in turn, produces forces to cause rotation of the rotor assembly 230, and due to the blades of the impellers 234, a pumping force is produced to pump the liquid coolant through the pump assembly 120.

In accordance with example implementations, the inlet barbed fitting 260 and the outlet barbed fitting 224 connect the liquid coolant pump assembly 120 to flexible tubing of a secondary cooling circuit. Although depicted in FIG. 2 as being ninety-degree angled fittings, in accordance with further implementations, the fittings 224 and 260 may be straight fittings, may be associated with angles other than ninety-degrees, may be non-barbed fittings, and so forth. The secondary cooling circuit, depending on the particular implementation may contain one or multiple liquid coolant pump assemblies 120. As depicted in FIG. 2, in accordance with example implementations, the inlet barbed fitting 260 is received in a seal bore 256 of the inlet connector housing 250; and the outlet barbed fitting 224 is received in a seal bore 272 of the outlet connector housing 270.

The inlet connector housing 250, in accordance with example implementations, has a male portion 254 that extends inside the central bore 214 of the ferromagnetic core 218, and the rotor assembly 230 is disposed inside the male portion 254. Moreover, one or multiple o-rings, gaskets, and so forth, may be used to form a liquid seal between the male portion 254 of the inlet connector housing 250 and the ferromagnetic core 218.

In accordance with example implementations, a male end 256 of the inlet barbed fitting 260 is received in the seal bore 256 of the inlet connector housing 250, and a barbed end 263 of the inlet barbed fitting 260 connects the pump assembly 120 to flexible tubing. As also depicted in FIG. 2, a retaining pin 261 may be inserted through a corresponding opening of the inlet connector housing 250 and into an annular groove of the male end 256 of the inlet barbed fitting 260 for purposes of securing the barbed fitting 260 to the inlet connector housing 250.

The outlet connector housing 270, in accordance with example implementations does not extend inside the central bore 214 of the ferromagnetic core 218 and is sealed to an end face of the ferromagnetic core 218 by a gasket 281, o-ring or other fluid seal. A male end 226 of the outlet barbed fitting 224 is received in the seal bore 272 of the outlet connector housing 270, and a barbed end 228 of the outlet barbed fitting 224 connects the pump assembly 120 to flexible tubing. A retaining pin 271 may be inserted through a corresponding opening of the outlet connector housing 270 and into an annular groove of the male end 226 of the outlet barbed fitting 224 for purposes of securing the barbed fitting 224 to the outlet connector housing 270.

As also depicted in FIG. 2, in accordance with example implementations, the inlet connector housing 250 and the outlet connector housing 270 have features to secure the housings 250 and 270 and armature 210 together. More specifically, the male portion 254 of the inlet connector housing 250 contains fins 255 that longitudinally extend along the longitudinal axis 201 and radially extend into gaps between the sections 211 of the ferromagnetic core 218. The inlet housing connector 250 has longitudinally extending arms 251 that extend on either side of the ferromagnetic core 218 and contain tangs 253 that engage corresponding tangs 283 of longitudinally extending arms 273 of the outlet connector housing 270 for purposes of securing the connector housings 250 and 270 and ferromagnetic core 218 together.

In accordance with example implementations, the coolant pump assembly 120 has features to enhance the transfer of waste thermal energy produced by operation of the pump assembly 120 into the liquid coolant flow. As depicted in FIG. 2, in accordance with some implementations, these features include a thermally conductive plate 203 that includes a main planar portion 204 that contacts an outer surface 217 of the armature 210 for purposes of conducting waste heat from the armature 210; a planar longitudinal extension 205 that contacts an outer surface of the inlet connector housing 250 for purposes of transferring thermal energy (i.e., part of the waste heat) to the outlet connector housing 250; and a planar longitudinal extension 206 that contacts an outer surface of the outlet connector housing 270 for purposes of transferring thermal energy (i.e., part of the waste heat) to the outlet connector housing 270.

In accordance with some implementations, the thermally conductive plate 203 may be formed from a highly thermally conductive material; and each of the inlet connector housing 250 and the outlet connector housing 270 may be formed from a thermally conductive material. Although the waste heat for the pump assembly 120 is generated in the armature 210 (and primarily in the windings 223), the path to the liquid coolant through the ferromagnetic core 218 and through the rotor assembly 230 may have a relatively low thermal conductivity due to the multiple layers in the path. The thermal path formed from the thermally conductive plate 203 and the inlet connector housing 250 and the thermal path formed the thermally conductive plate 203 and the outlet connector housing 270 each has a relatively higher thermal conductivity for transferring the waste heat to the liquid coolant.

As used herein, a thermally conductive "plate" refers to a member that is formed from a thermally conductive material or a highly thermal conductive material, and the member contains one or multiple flat (i.e., planar or substantially flat) portions, as depicted for the example implementation of the plate 203 that is depicted in FIG. 2. However, the plate may contain additional portions other than a flat portion that contacts the outer surface 217 of the armature 210, in accordance with example implementations. For example, as further described herein, in accordance with some implementations, a thermally conductive plate may contain orthogonally extending side portions, which extend over side surfaces of the armature 210 and extend from one or multiple upper flat portions of the plate.

FIG. 3A depicts a top view of the armature 210 in accordance with example implementations. As depicted in FIG. 3A, the bobbins 224 circumscribe respective sections 211 of the ferromagnetic core 218 (and accordingly, the corresponding windings 223 circumscribe respective portions of the ferromagnetic core 218). One way to construct the armature 210 is to allow air gaps between the windings 223 and the ferromagnetic core 218. In general, these air gaps are due to the imperfect nature of the winding of the wire about the ferromagnetic core 218. The air gaps hinder the heat transfer from the windings 223 into the core 208 (and into the liquid coolant). In other words, the windings 223 may generate a significant amount of waste heat for the pump assembly 120 during operation of the pump assembly 120, and due to such air gaps, this waste heat may not be efficiently transferred from the windings 223 to the ferromagnetic core 218 (and then to the liquid coolant).

The air gaps also introduce power-related inefficiencies in the transmission of the magnetic field from the windings 223 to the ferromagnetic core 208. In this manner, air gaps cause a loss of magnetic field. When air gaps are present, more power is produced to create a stronger magnetic field to overcome the magnetic field losses and drive the motor, as compared to the power produced to drive the motor to achieve the same speed when no air gaps are present. Therefore, to maintain the magnetic field strength and make up for the losses caused by the air gaps, the power to the windings 223 is correspondingly increased.

In accordance with example implementations, air gaps that otherwise exist between the windings 223 and the ferromagnetic core 218 are filled with a thermally conductive material 300 (depicted in FIG. 3A in an exaggerated view and in FIG. 3B in partial cross-sectional view), such as a thermally conductive epoxy. In general, the thermally conductive material enhances the transfer of the waste heat from the windings 223 (the largest source of the pump assembly's waste heat) to the ferromagnetic core 218. Exemplary cross-sections of two windings 223-1 and 223-2 are depicted in FIG. 3B. In addition to enhancing the transfer of the waste heat to the liquid coolant, the use of the thermally conductive compound 300 inhibits, if not prevents, the fringing of magnetic flux, thereby increasing the pump assembly's power efficiency.

In accordance with some implementations, the thermally conductive compound 300 may be introduced in a number of different ways to fill any air gaps. For example, in accordance with some implementations, after the wire is wound about the sections 211 of the ferromagnetic core 218 to form the windings 223, the thermally conductive compound may be injected into any air gaps between the windings 223 and the ferromagnetic core 218. In accordance with further example implementations, the entire armature 210 may be potted within the thermally conductive compound 300.

Figure 5:
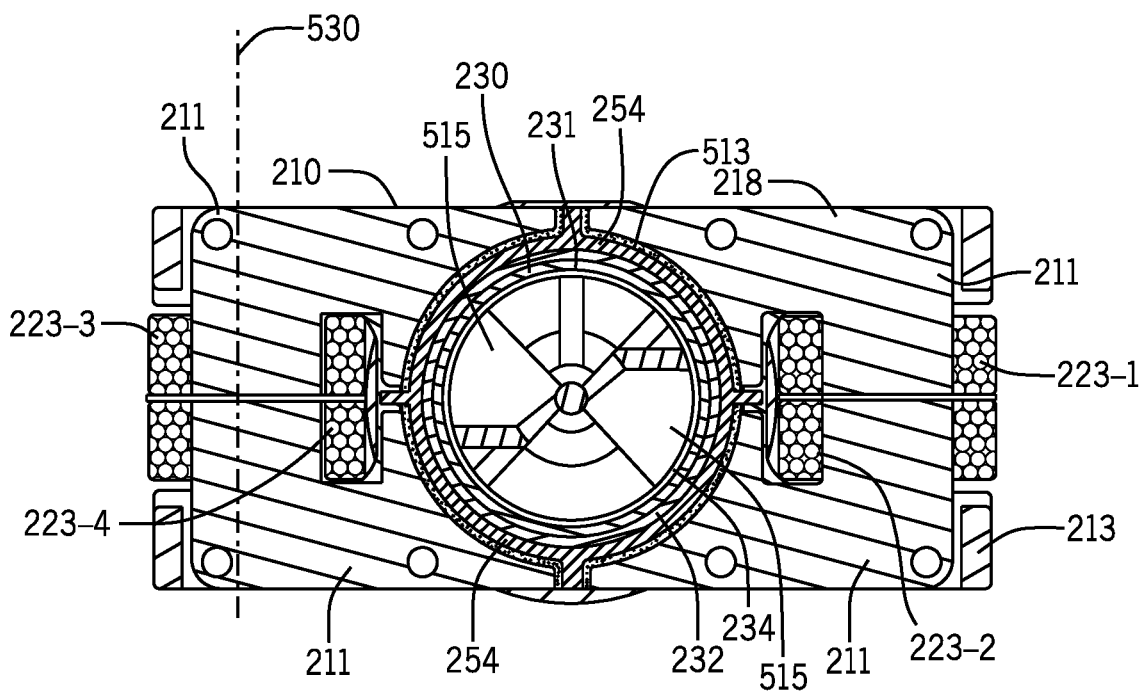
FIG. 5 is a cross-sectional view of the pump assembly of FIG. 2 taken along line 5-5 of FIG. 2 illustrating the use of a thermally conductive compound to aid the transfer of waste heat to a liquid coolant flow according to an example implementation.

In accordance with some implementations, the thermally conductive plate 203 of FIG. 2 may be replaced with a thermally conductive plate 406 (FIG. 4), which has features to further enhance the thermal contact with the armature 210. More specifically, FIG. 4 depicts a partial exploded view 404 of a liquid coolant pump assembly, in accordance with further implementations, that has an alternative thermally conductive plate 406 (replacing the thermally conductive plate 203 of FIG. 2). Referring to FIG. 4, the thermally conductive plate 406 contains a main top planar portion 408 and planar extensions 412 and 414 similar to the main portion 204 and the extensions 205 and 206, respectively, of the thermally conductive plate 203. The main top planar portion 408 contains the upper surface 217 of the ferromagnetic core 218. Moreover, the planar extensions 412 and 414 contact corresponding planar, or flattened, portions 424 and 420 of the inlet connector housing 250 and the outlet connector housing 270, respectively. Moreover, unlike the thermally conductive plate 203, the thermally conductive plate 406 has side extensions 410 that orthogonally extend from the main top planar portion 408 over opposing sides of the armature 210 to contact the windings 223. Because the windings 223 generate most of the waste, thermal contact FIG. 5 is a cross-sectional view of the pump assembly 120 of FIG. 2 (taken along line 5-5 of FIG. 2) according to an example implementation. In particular, FIG. 5 depicts the male portion 254 of the inlet connector housing 250 and the rotor assembly 230 inside the central bore 214. In accordance with some implementations, a thermally conductive material 513, such as a thermally conductive epoxy, may be used to fill any gaps between the male portion 254 of the inlet connector housing 250 and the wall of the ferromagnetic core 218 (which circumscribes the central bore 214). Due to this thermally conductive compound, thermal transfer may be further enhanced to transfer waste heat from the ferromagnetic core 218 to the liquid coolant.

FIG. 5 further depicts an orientation of the windings 223 of the armature 210. In accordance with some implementations, as depicted in FIG. 5, the windings 223 may have a winding orientation about a vertical axis. As an example, FIG. 5 depicts windings 223-3 and 222-4 being wound about vertical axis 530. This particular winding orientation may be beneficial for allowing the windings to contact a thermally conductive plate, as depicted in FIG. 4.

The winding orientations may, however, be different, in accordance with further example implementations. More specifically, referring to FIG. 6, in accordance with further example implementations, an armature 610 may be used in place of the armature 210 and include windings 610 that are oriented about a horizontal axis 630. The orientation of the windings 610 in this orientation allows more contact between a thermally conductive plate 604 that extends across the top of the armature 601 in that with the windings 610 in this orientations, the winding 610 contact the plate 604 to enhance the transfer of waste heat to the plate 604.

Figure 6:
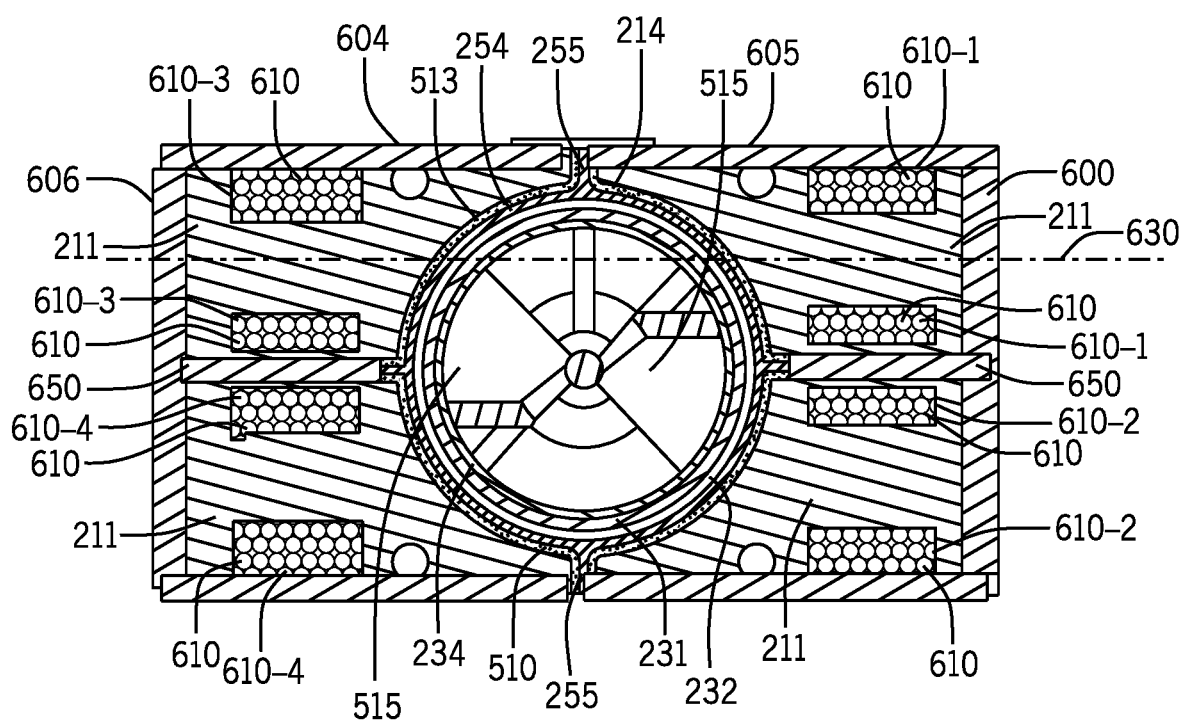
FIG. 6 is a cross-sectional view of a micro-axial pump assembly illustrating an alternative winding orientation for the armature to enhance thermal contact with the thermal transfer plate according to an example implementation.

FIG. 6 also illustrates the use of multiple thermally conductive plates that contact the top, bottom and sides of the armature 610. In accordance with some implementations, each of the plates may extend to contact corresponding flattened surface of the inlet and outlet connector housings. In accordance with further example implementations, all four plates may contact each other and one, two or three of the plates may contact the inlet and/or outlet connector housings. Moreover, as also depicted in FIG. 6, in accordance with some implementations, thermally conductive plates 650 may be disposed between the sections 211 of the ferromagnetic core 218; and the plates 650 may or may contact the inlet and/or outlet connector housings.

Figure 7A:
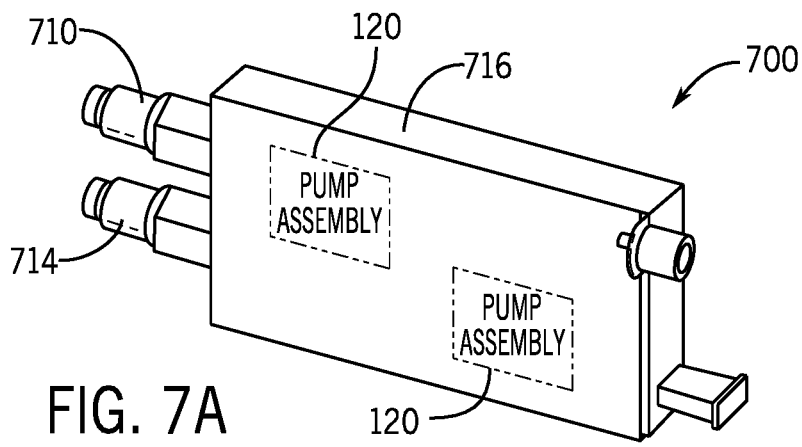
FIG. 7A is a perspective view of a pump module containing multiple micro-axial pump assemblies according to an example implementation.

Referring to FIG. 7A, in accordance with some implementations, multiple pump assemblies may be included in a sealed pump module 700. In this manner, the pump assemblies may be connected in series (i.e., one pump may flow into the other pump) or may be connected in parallel (i.e., the incoming flow may be split between two pump assemblies). In general, the pump module 700 includes an outer housing 716, which may be constructed from a highly thermally conductive material (a metal housing, for example), in accordance with some implementations. Moreover, the sealed pump module 700, in accordance with example implementations, includes an inlet connector housing 714 and an outlet connector housing 710. Depending on the particular implementation, the inlet connector housing 714 and the outlet connector housing 710 may be constructed from a highly thermally conductive material or a thermally conductive material.

Figure 7B:
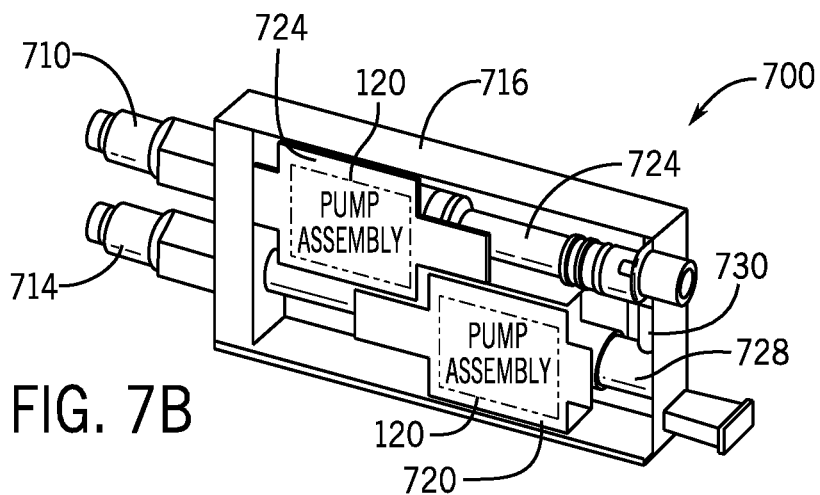
FIG. 7B is a perspective view of the pump assembly of FIG. 7A with a portion of an outer housing of the pump module removed according to an example implementation.
Figure 7C:
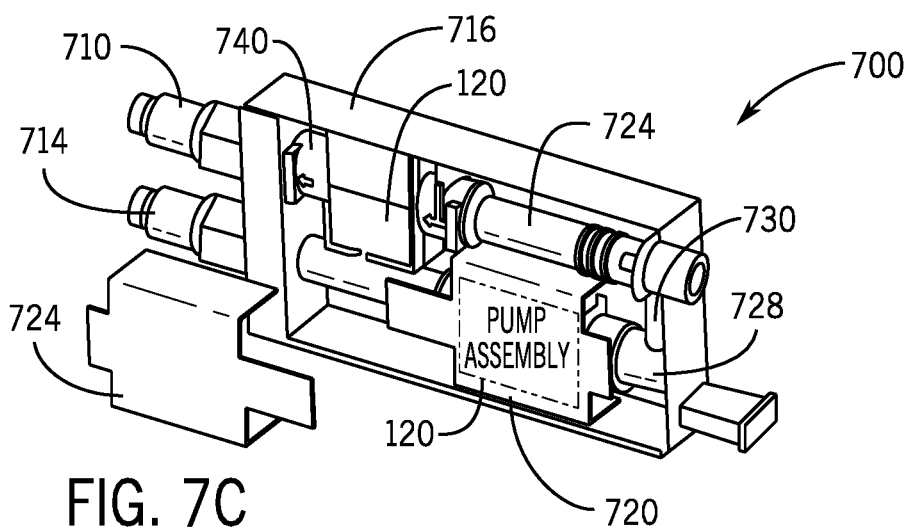
FIG. 7C is a partial exploded perspective view of the pump module of FIG. 7B according to an example implementation.

FIGS. 7B and 7C depict partial removal of the pump module housing 716. As shown, two liquid coolant pump assemblies 120 may be disposed inside the housing 716, and thermally conductive plates 720 and 724 may be used to transfer heat from the respective armatures of the pump assemblies 120 to the inlet connector housing 714 and the outlet connector housing 710.

For the particular implementation that is depicted in FIG. 7C, the pump assemblies 120 are connected in series. One pump assembly 120 is connected to receive an incoming liquid coolant flow through the inlet connector housing 714 and provide an outgoing flow at an outlet 728. The outlet 728, in turn, is connected to an inlet 730 of the other pump assembly 120, and an outlet 724 of this other pump assembly 120 provides an outgoing flow for the module 700 to the outlet connector housing 710.

In accordance with further example implementations, a pump module may contain more than two liquid coolant pump assemblies. Moreover, in accordance with further example implementations, a pump module may contain liquid coolant pump assemblies that are connected in parallel, liquid coolant pump assemblies that are connected in parallel and liquid coolant pump assemblies that are connected in series, and so forth.

Figure 8:
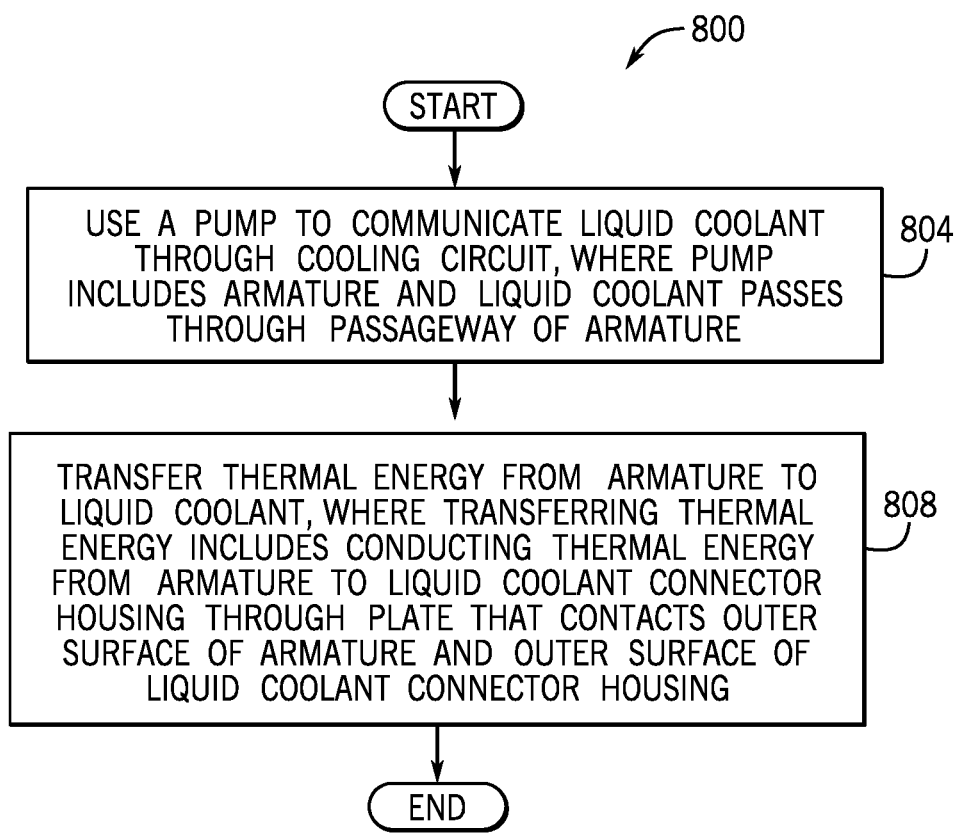
FIG. 8 is a flow diagram depicting a technique to transfer thermal energy to a liquid coolant using a plate according to an example implementation.

Referring to FIG. 8, in accordance with example implementations, a technique 800 includes using (block 804) a pump to communicate a liquid coolant through a cooling circuit. The pump includes an armature, and the liquid coolant passes through a passageway of the armature. The technique 800 includes transferring (block 808) thermal energy from the armature to the liquid coolant. The transferring includes conducting thermal energy from the armature to a liquid coolant connector housing through a plate that contacts an outer surface of the armature and an outer surface of the liquid coolant connector housing.

Figure 9:
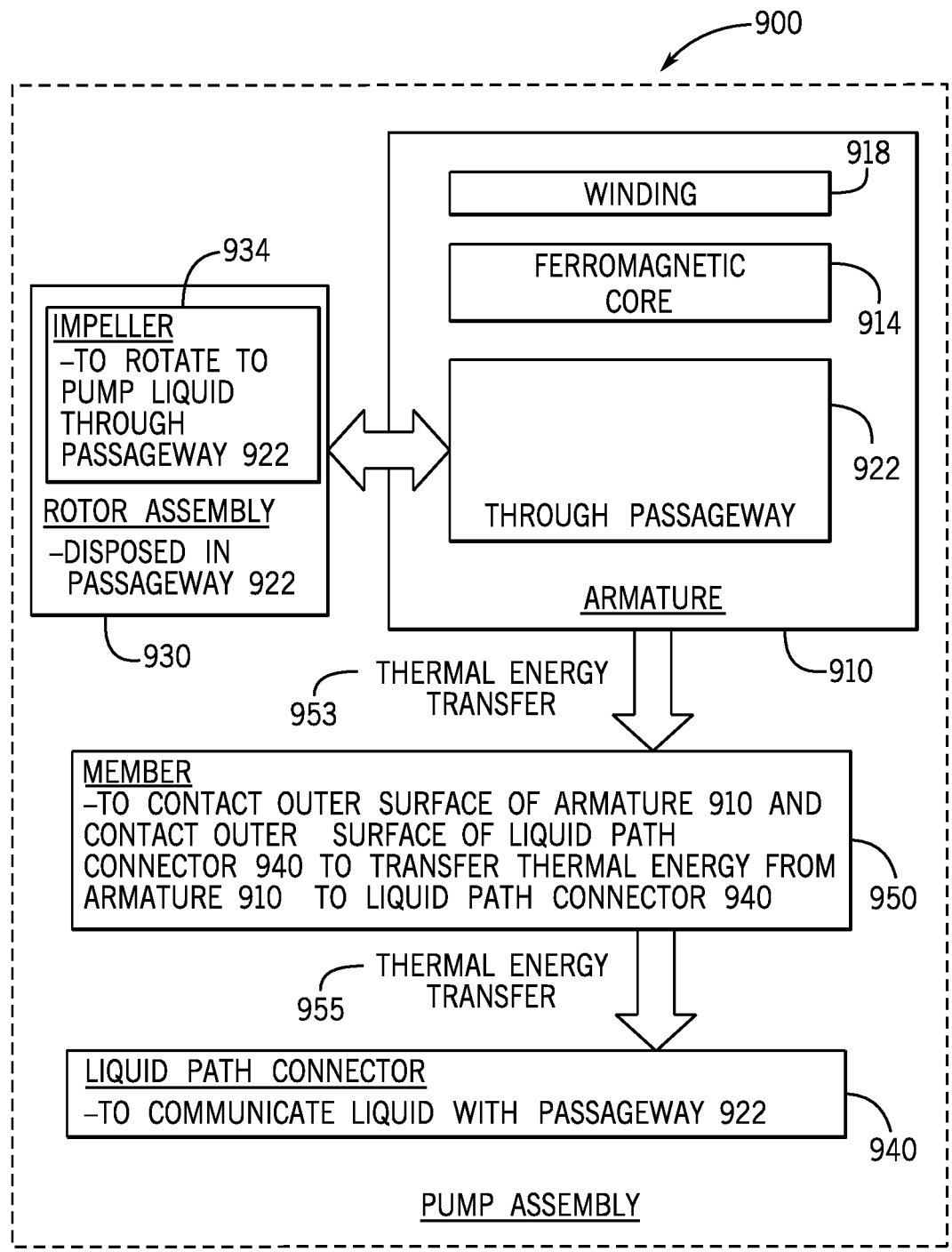
FIG. 9 is a schematic diagram of an apparatus to transfer thermal energy from an armature to a liquid path connector according to an example implementation.

Referring to FIG. 9, in accordance with example implementations, a pump assembly 900 includes an armature 910; a rotor assembly 930; a liquid path connector 940; and a member 950. The armature 910 includes a ferromagnetic core 914, a winding 918 and a through passageway 922. The rotor assembly 930 is disposed in the through passageway 922 and includes an impeller 934 to rotate the pump liquid through the passageway 922. The liquid path connector 940 is connected to the armature 910 to communicate the liquid with the passageway 922; and the member 950 contacts the outer surface of the armature 910 and the outer surface of the liquid path connector 940 to transfer thermal energy from the armature 910 to the liquid path connector 940, as depicted at reference numerals 953 and 955.

Figure 10:
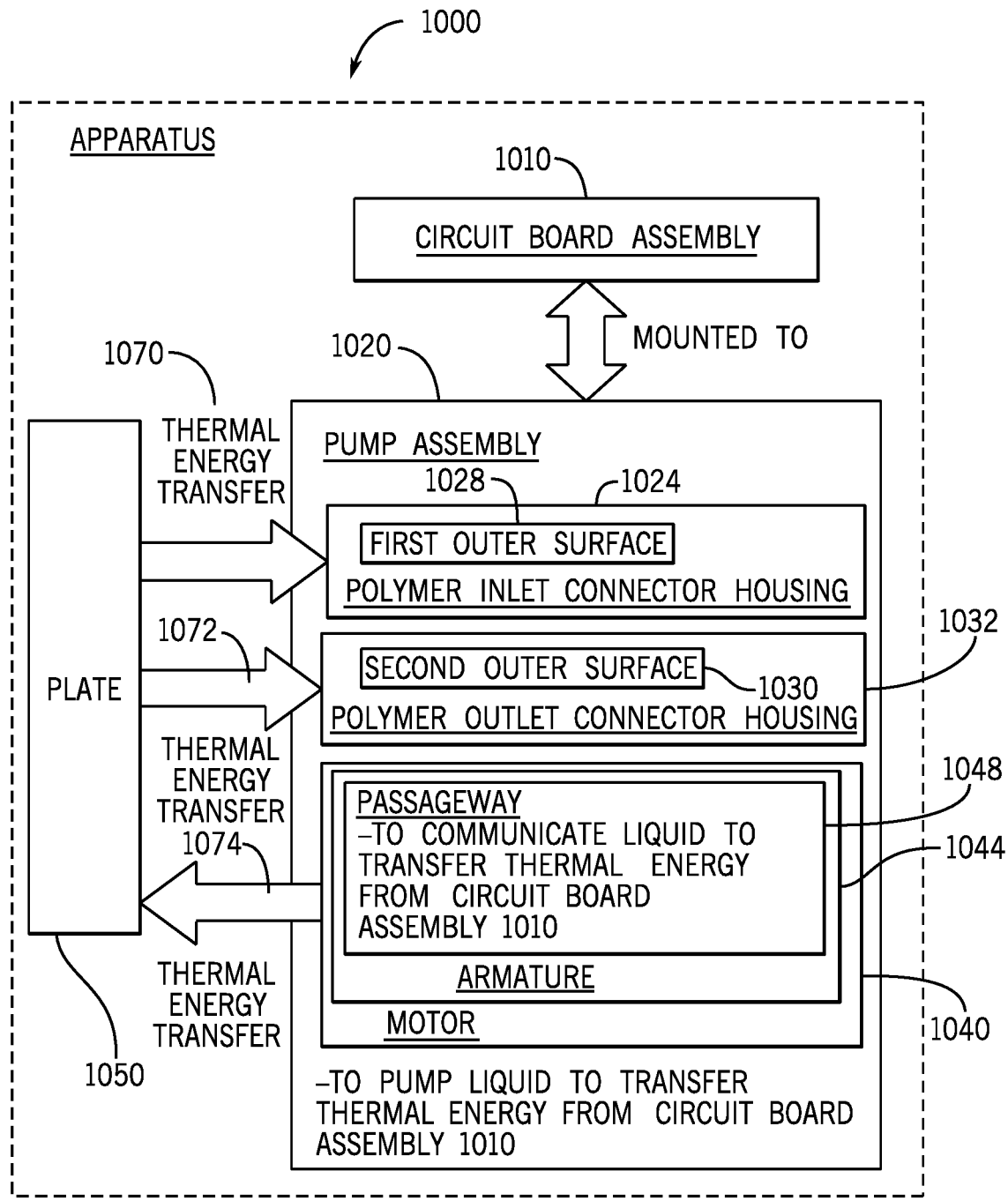
FIG. 10 is a schematic diagram of an apparatus to transfer thermal energy from an armature of a pump assembly to inlet and outlet connector housings of the pump assembly according to an example implementation.

Referring to FIG. 10, in accordance with example implementations, an apparatus 1000 includes a circuit board assembly 1010; and a pump assembly 1020 that is mounted to the circuit board assembly 1010 to pump a liquid to transfer thermal energy from the circuit board assembly 1010. The pump assembly 1020 includes a polymer inlet connector housing 1024 having a first outer surface 1028; a polymer outlet connector housing 1032 having a second outer surface 1030; a motor 1040 and a plate 1050. The motor 1040 includes an armature 1044 that includes a passageway 1048 to communicate the liquid; and the inlet connector housing 1024, the outlet connector housing 1032 are liquidly connected to the passageway 1048 to communicate liquid through the passageway 1048. The plate 1050 contacts the first outer surface 1028, the second outer surface 1030 and the armature 1044 to transfer thermal energy from the armature 1044 (as depicted at reference numeral 1074) to the inlet connector housing 1024 (as depicted at reference numeral 1070) and the outlet connector housing 1032 (as depicted at reference numeral 1072).

In accordance with example implementations, the pump assemblies that are described herein may have one or more of the following features. The liquid path connector may include a polymer housing having an opening to receive a liquid fitting. This allows readily available barb-typed fittings to be used with the pump assembly.

In accordance with some implementations, the polymer housing may include a polymer that has a thermal conductivity along an axis of at least 0.5 $W \cdot m^{-1} \cdot K^{-1}$ or greater at any temperature between 0° C. and 100° C. A thermally conductive polymer has the advantage of enhancing the transfer of waste heat to the liquid.

In accordance with some implementations, the member may include a plate, and a surface of the plate may be contoured to a portion of the liquid path connector. These features improve thermal contact between the member and the liquid path connector to enhance the conduction of waste heat to the liquid.

In accordance with some implementations, the portion of the plate that is contoured to the portion of the liquid path connector may include a planar surface. This feature improves thermal contact between the plate and the liquid path connector to enhance the conduction of waste heat to the liquid.

In accordance with some implementations, the liquid path connector may include an anisotropic thermally conductive polymer. This feature may improve the transfer of waste heat to the liquid.

In accordance with some implementations, a thermally conductive compound may be disposed between the winding and the ferromagnetic core. This has the particular advantage of enhancing the transfer of thermal energy to the liquid and to decreasing the power to the pump assembly.

In accordance with some implementations, the thermally conductive compound may be an epoxy having a thermal conductivity of 1 $W \cdot m^{-1} \cdot K^{-1}$ or greater at any temperature between 0° C. and 100° C. This feature may improve the transfer of waste heat to the liquid.

In accordance with some implementations, a thermally conductive compound may be disposed between wall of the ferromagnetic core and a portion of the liquid path connector. This has the particular advantage of enhancing the conduction of waste heat to the liquid.

In accordance with some implementations, the member may extend between adjacent ferromagnetic core sections. This feature may enhance the transfer of thermal energy to the liquid.

In accordance with some implementations, multiple windings of the armature may contact the thermal bridge. This has the particular advantage of increasing the thermal contact with the thermal bridge to further enhance the transfer of waste heat to the coolant.

In accordance with example implementations, the pump assembly may include a housing, where the armature, the rotor assembly, the liquid path connector and the member are disposed inside the housing. This arrangement increases portability and applications of the pump assembly.

In accordance with example implementations, the armature, the rotor assembly and the liquid path connector are part of a first liquid coolant pump; and the pump assembly may further include another liquid coolant pump that is disposed inside the housing and connected in series or in parallel with the first liquid coolant pump. This arrangement may add redundancy capability for the pump assembly and/or add flow capacity to the pump assembly.

In accordance with example implementations, the member may be a plate. This may enhance the transfer of waste heat to the liquid.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A pump assembly comprising:
   an armature comprising a ferromagnetic core, a winding and a through passageway;
   a rotor assembly disposed in the passageway and comprising an impeller to rotate to pump liquid through the passageway;
   a liquid path connector connected to the armature to communicate the liquid with the passageway; and
   a member to contact an outer surface of the armature and contact an outer surface of the liquid path connector to transfer thermal energy from the armature to the liquid path connector.

2. The pump assembly of claim 1, wherein:
   the liquid path connector comprises a polymer housing having an opening to receive a liquid fitting.

3. The pump assembly of claim 2, wherein the polymer housing comprises a polymer having a thermal conductivity along an axis of 0.5 $W \cdot m^{-1} \cdot K^{-1}$ or greater at any temperature between 0° C. and 100° C.

4. The pump assembly of claim 1, wherein the member comprises a plate, and the plate comprises a surface contoured to a portion of the liquid path connector.

5. The pump assembly of claim 4, wherein the surface of the plate contoured to the portion of the liquid path connector comprises a planar surface.

6. The pump assembly of claim 1, wherein the liquid path connector comprises an anisotropic thermally conductive polymer.

7. The pump assembly of claim 1, further comprising a thermally conductive compound between the winding and the ferromagnetic core.

8. The pump assembly of claim 7, wherein the thermally conductive compound comprises an epoxy having a thermal conductivity of 1 $W \cdot m^{-1} \cdot K^{-1}$ or greater at any temperature between 0° C. and 100° C.

9. The pump assembly of claim 1, wherein the liquid path connector comprises a portion that extends inside the passageway, and the ferromagnetic core comprises a wall to circumscribe the passageway and circumscribe the portion of the liquid path connector, the pump further comprising:
   a thermally conductive compound between the wall of the ferromagnetic core and the portion of the liquid path connector.

10. The pump assembly of claim 1, wherein the ferromagnetic core comprises adjacent ferromagnetic core sections, and the member extends between the adjacent ferromagnetic core sections.

11. The pump assembly of claim 10, wherein the winding circumscribes a first ferromagnetic core section of the adjacent ferromagnetic core sections, the pump assembly further comprises another winding to circumscribe a second ferromagnetic core section of the adjacent ferromagnetic core sections, and the windings contact the member.

12. The pump assembly of claim 1, further comprising:
    a housing, wherein the armature, the rotor assembly, the liquid path connector and the member are disposed inside the housing.

13. The pump assembly of claim 12, wherein the armature, the rotor assembly and the liquid path connector are part of a first liquid coolant pump, and the pump assembly further comprises another liquid coolant pump disposed inside the housing and connected in series or in parallel with the first liquid coolant pump.

14. The pump assembly of claim 1, wherein the member comprises a plate.

15. An apparatus comprising:
    a circuit board assembly comprising a heat dissipating component; and
    a pump assembly mounted to the circuit board assembly to pump a liquid to transfer thermal energy from the heat dissipating component, wherein the pump assembly comprises:
      a polymer inlet connector housing having a first outer surface;
      a polymer outlet connector housing having a second outer surface;
      a motor comprising an armature comprising a passageway to communicate the liquid, wherein the inlet connector housing and the outlet connector housing are liquidly connected to the passageway to communicate the liquid through the passageway; and
      a plate to contact the first outer surface, the second outer surface and the armature to transfer thermal energy from the armature to the inlet connector housing and the outlet connector housing.

16. The apparatus of claim 15, wherein the inlet connector housing and the outlet connector housing each comprises a material having a thermal conductivity along an axis of 0.5 $W \cdot m^{-1} \cdot K^{-1}$ or greater at any temperature between 0° C. and 100° C.

17. The apparatus of claim 15, wherein the circuit board assembly comprises at least one of a central processing unit (CPU) or a mass storage device.

* * * * *